United States Patent

Tsukamoto et al.

Patent Number: 6,074,485
Date of Patent: Jun. 13, 2000

[54] CRYSTAL GROWTH OBSERVING APPARATUS USING A SCANNING TUNNELING MICROSCOPE

[75] Inventors: Shiro Tsukamoto; Nobuyuki Koguchi, both of Ibaraki, Japan

[73] Assignee: National Research Institute for Metals, Ibaraki, Japan

[21] Appl. No.: 09/206,976

[22] Filed: Dec. 8, 1998

[30] Foreign Application Priority Data

Dec. 10, 1997 [JP] Japan ................................. 9-340413

[51] Int. Cl.[7] ................................................ B05C 11/00
[52] U.S. Cl. ........................ 118/713; 118/712; 117/85; 117/201
[58] Field of Search .............. 117/85, 201; 118/723 VE, 118/723 CB, 723 EB, 712, 713

[56] References Cited

U.S. PATENT DOCUMENTS

| | | | |
|---|---|---|---|
| 4,732,108 | 3/1988 | Erickson | 118/713 |
| 5,323,003 | 6/1994 | Shido et al. | 250/306 |
| 5,582,646 | 12/1996 | Woollam et al. | 118/712 |

FOREIGN PATENT DOCUMENTS 174699  7/1987  Japan .

Primary Examiner—Shrive Beck
Assistant Examiner—Sylvia R. MacArthur
Attorney, Agent, or Firm—Wenderoth, Lind & Ponack, L.L.P.

[57] ABSTRACT

A STM drive mechanism capable of moving a scanning tunneling microscope (STM) incorporated with a molecular beam epitaxy (MBE) device in the MBE device under vacuum and a substrate holder with a wide clearance formed between a substrate heating system and the substrate holder are provided. The STM is protected by a heat insulating shield from high vapor pressure atmosphere and radiant heat according to substrate heating.

3 Claims, 5 Drawing Sheets

F I G. 1
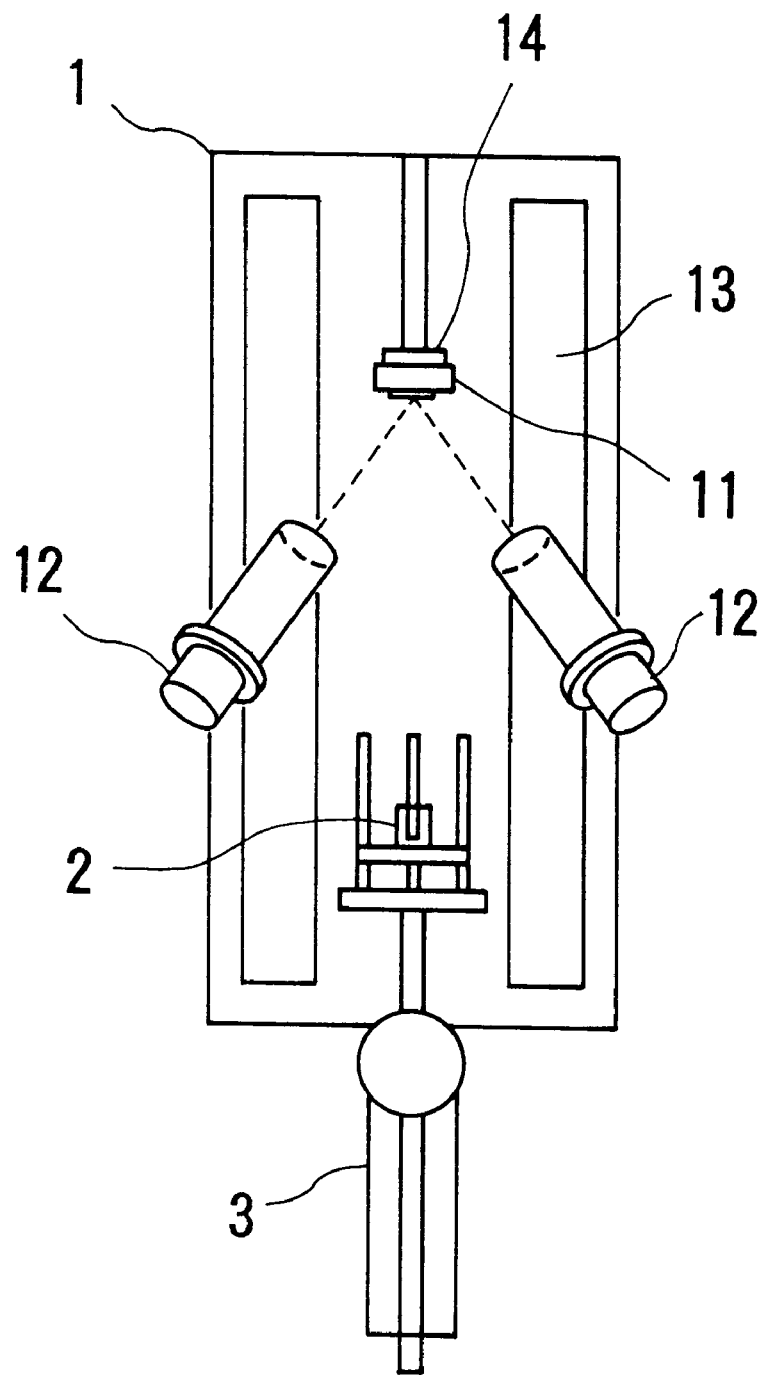

F I G. 3
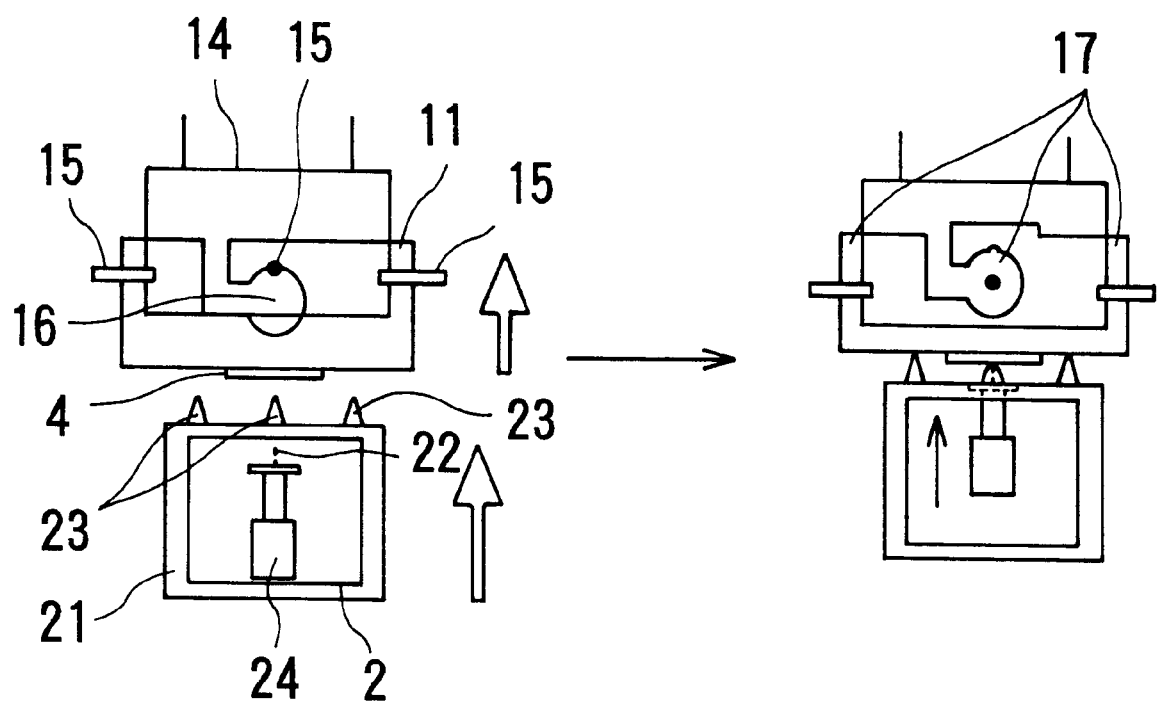

CRYSTAL GROWTH OBSERVING APPARATUS USING A SCANNING TUNNELING MICROSCOPE

FIELD OF THE INVENTION

The present invention relates to a crystal growth observing apparatus. More particularly, the present invention relates to a crystal growth observing apparatus which permits observation of crystal growth at a stare where a crystal(s) is growing.

DESCRIPTION OF THE PRIOR ART

With respect to crystal growth, observation in the growing process is one of the most important matters. Since uniformity of growth at the atomic level is particularly required in the quantum nano structure which has recently been attracted, an observing technique at a state where a crystal(s) is growing is needed.

For example, a reflecting high-speed electron beam diffraction method and a reflectance difference spectral method have already been put into practice for the crystal growth by the molecular beam epitaxy (MBE) and permit real-time observation of crystal growth.

These conventional methods of observing crystal growth only permit average estimation of real spaces at levels more than the micro one, but cannot estimate individual real spaces at the atomic level.

Using a scanning tunneling microscope (STM) having space resolution of die atomic level for an estimating means has recently been considered in order to realize an observing method of crystal growth at a state where a crystal(s) is growing.

Observation with the STM in the MBE device is, in fact, very difficult because of high vapor pressure atmosphere of raw materials in MBE growing and of acoustic noise and vibration from machines such as a shroud for liquid nitrogen and a pump.

An observation of crystal growth using the apparatus has been reported. The apparatus consists of a MBE device and a STM device, each of which has an individual vacuum vessel and is connected to the other through a gate valve which is adapted to be used in ultra high vacuum. When observation is performed, the gate valve is opened and a sample crystal(s) grown in the MBE device is removed to the STM device through the gate valve. In the apparatus, a physical region is divided into two parts, i.e., one for MBE crystal growth and the other for STM observation. These two parts are isolated from each other by the gate valve in order to prevent undesirable influences as high vapor pressure atmosphere, acoustic noise and vibration. The observation with the apparatus is, on the other hand, far from the observation of crystal growth at a state where a crystal(s) is growing because, in the procedure, which crystal growth is stopped, substrate temperature is reduced, the sample crystal (s) is removed to the STM device through the gate valve opened, and then observation is performed.

As described in the above, though the necessity of observation of crystal growth at a state where a crystal(s) is growing has been strongly demanded, observation which is performed at the atomic level by the STM and satisfies the original meaning of the observation at a state where a crystal(s) is growing has not been accomplished so far.

SUMMARY OF THE INVENTION

The present invention has an object to overcome such hurdles in the conventional technology as described above and to provide a new crystal growth observing apparatus which permits observation of crystal growth at a state where a crystal(s) is growing, which is performed at the atomic level in the same region as a STM region without a sample crystal(s) removed.

This and other objects, features and advantages of the invention will become more apparent upon reading the following specification and drawings, in which:

BRIEF DESCRIPTION OF THE DRAWINGS

FIG. 1 is a schematic view illustrating a structure of a crystal growth observing apparatus of the present invention;

FIG. 3 is a schematic view illustrating a structure for incorporation;

EMBODIMENTS

Figure 2:
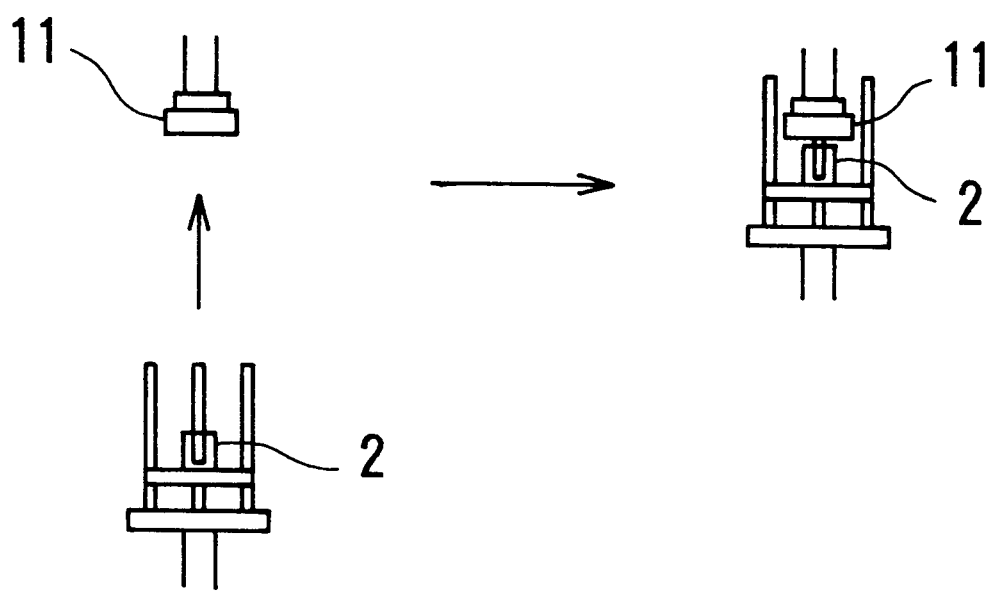
FIG. 2 is a schematic view illustrating incorporation of a substrate holder with a STM.

The present invention provides an apparatus for observing crystal growth, comprising a molecular beam epitaxy device having a vacuum vessel; a scanning tunneling microscope having a probe, the scanning tunneling microscope being incorporated with the molecular beam epitaxy device and being protected from vapor pressure atmosphere and radiant heat by a heat insulating shield; a substrate holder disposed in the vacuum vessel of the molecular beam epitaxy device, the substrate holder being provided with a substrate heating system and being supported only by the scanning tunneling microscope in contact with the substrate holder during observation; and a drive mechanism for causing the scanning tunneling microscope to move upward and downward while leaving the scanning tunneling microscope opposed to the substrate holder.

As described above, the present invention has one of the features in that a scanning tunneling microscope (STM) is incorporated with a molecular beam epitaxy (MBE) device and observation is performed by the STM in the space where the crystal(s) is in process of MBE growing. In the present invention, phrase "observation at a state where a crystal(s) is growing" means STM observation of crystal growth at the atomic level in the same space as one in which MBE crystal growing is proceeding.

For realizing such observation, in the present invention, a substrate holder placed well apart from a substrate heating system, a heat insulating shield covering a whole of the STM and a STM drive mechanism are provided.

The substrate holder has a wider clearance than a holder generally used, so that vibration transmitted from the MBE can be cut off.

Since the STM is protected by the heat insulating shield, such influences as from high vapor pressure atmosphere and radiant heat according to substrate heating are suppressed. Especially, a bad effect to a micro-drive mechanism of the STM probe is prevented.

As illustrated in FIG. 1, in the crystal growth observing apparatus, a substrate holder (11) with a heating system, molecular beam cells (12) and a shroud for liquid nitrogen (13) are provided with a molecular beam epitaxy device: MBE device (1) and are disposed in a vacuum vessel. For moving a scanning tunneling microscope: STM (2) upward and downward, a STM drive mechanism (3) is provided.

As illustrated in FIG. 2, when observation is performed, the STM (2) is moved upward and is incorporated with the substrate holder (11). Crystal growth on the surface of a substrate sample, which is supported by the substrate holder (11) and is in the process of MBE crystal growing, is observed by the STM (2).

As illustrated in FIG. 3, the substrate holder (11), which is one of the parts comprising the MBE device (1), holds a substrate (4). A substrate heating system (14) is provided with the substrate holder (11). The substrate holder (11) is supported by the engagement of three pins (15) extending in the horizontal direction from a peripheral surface of a casing of the substrate heating system (14) with notches (16) formed in the casing. The substrate holder (11) is placed apart from the casing of the substrate heating system (14) so as to form a clearance (17) between the substrate holder (11) and side and bottom surfaces of the casing.

In the STM (2), a STM scanner (24) is covered with a heat insulating shield (21), which protects the STM scanner (24) not only from MBE high vapor pressure atmosphere but also from radiant heat according to substrate heating. Projections (23) are provided at the upper portion of the heat insulating shield (21).

The STM scanner (24) is of micro size and can slightly move along the directions of the X-Y-Z three axes. A STM probe (22) is secured at the upper portion of the STM scanner (24). When STM observation is performed, the STM probe (22) is projected from the inside of the heat insulating shield (21) and is opposed to the surface of the substrate (4), permitting observation of crystal growth.

With respect to the projections (23), the shape, number and disposition are not restricted, but conical or pyramid shape is preferable. The number of projections is preferably three so as to come into contact with the surface of the substrate holder (11) at three positions. One of the three projections (23) can also serve as an electric terminal which permits tunnel current between the substrate holder (11) and the projection. In this case, the projection is insulated from the heat insulating shield (21).

Figure 4:
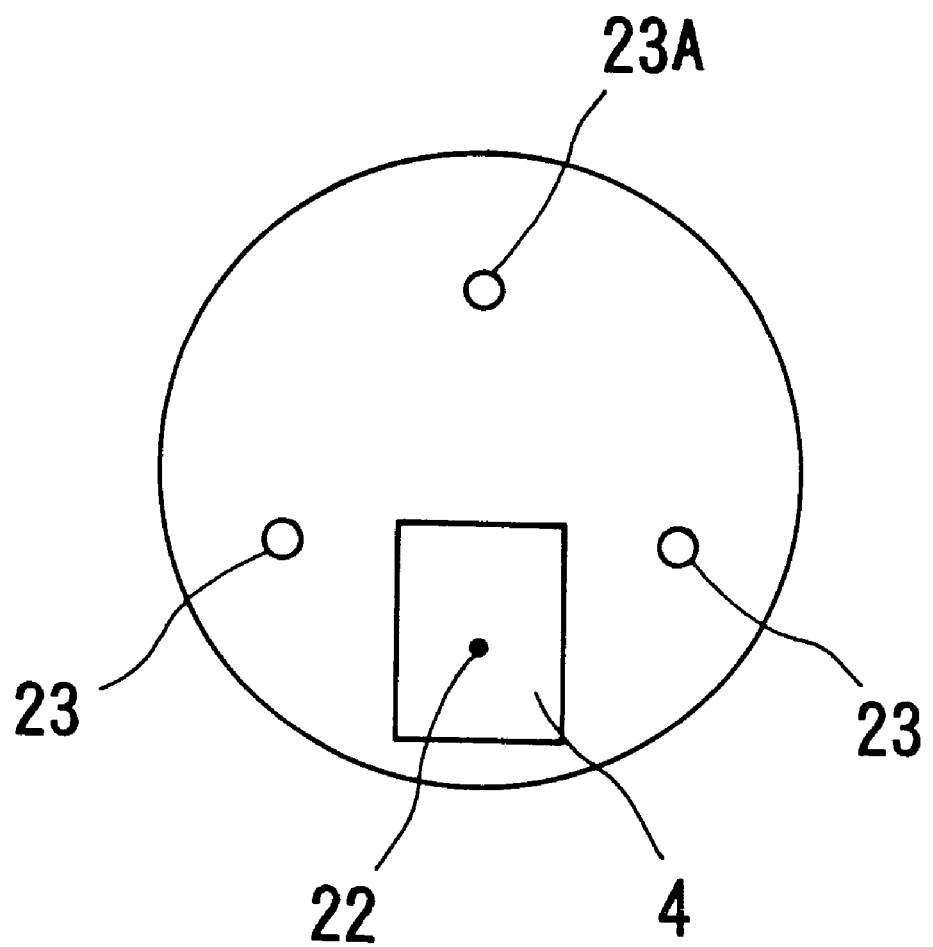
FIG. 4 is a plan view illustrating positional relationship between a substrate on a substrate holder and projections of a STM.

As illustrated in FIG. 4, three projections (23) are disposed at vertices of a triangle and come into contact with the surface of the substrate holder (11). A projection (23A) among the three serves as an electric terminal.

The STM drive mechanism (3) causes the STM (2) to move upward in the MBE device (1) preserved in a vacuum state and, as illustrated in FIG. 3, causes the projections (23) to come into contact with the surface of the substrate holder (11) opposed thereto at three positions. Subsequently, the STM drive mechanism (3) causes the STM probe (22) to be disposed close to the surface of the substrate (4) so as to observe crystal growth on the surface of the substrate (4) based on tunnel current.

The STM drive mechanism (3) causes the STM (2) to move downward in order to house the STM (2) in the shroud for liquid nitrogen when observation at a state where a crystal(s) is growing is not necessary, for example, during long-time buffer growth.

A narrow pipe(s) into which wiring of the STM (2) is inserted may be provided in the strut of the STM drive mechanism (3) so that the MBE (1) can be connected to a control device disposed at the outside of the MBE device (1).

The narrow pipe can also protect the wiring of the STM (2) from electromagnetic noise from the molecular beam cells (12).

Observation of crystal growth using the above-mentioned apparatus of the present invention will be explained as follows:

The STM (2) is housed in the lower portion of the MBE device (1) by the STM drive mechanism (3) and a buffer is made to grow with a MBE growing method generally used after cleaning the surface of the substrate (4) supported by the substrate holder (11). The STM (2) is moved upward with the temperature of the sample maintained so as to be incorporated with the substrate holder (11) as illustrated in FIG. 3. The substrate holder (11) is separated from the substrate heating system (14) of the MBE device (1). The substrate holder (11) itself is incorporated with the STM (2) and is placed with the wide clearance (17) formed between the substrate holder (11) and the substrate heating system (14). Subsequently, the STM probe (22) is moved into contact with the substrate holder (4) and a STM observation mode is prepared.

Raw materials are supplied in the MBE in order to perform STM observation by opening a shutter of the molecular beam cells (12).

According to the present invention, condition searching for producing a quantum nano structure will be facilitated and a quantum nano structure with the regulated size will be produced.

Elucidation of the principle of a crystal growing mechanism will also be promoted.

Improvement of the quality of quantum nano structure, which has been considered to be difficult, will be realized, control of the size will be facilitated, and devices with a quantum nano structure will be developed. In addition, a new nano-drawing such as a temporary patterning together with crystal growth by scanning the probe (22) of the STM (2) will be possible.

It is also feasible according to the present invention to produce quite a new growing mechanism according to the effect of high electric field between the probe and the sample, which is derived from a tunneling phenomenon.

Now, the present invention will be described in more detail by way of an example. Of course, the present invention is not restricted to the example.

EXAMPLES

Ga crystals were made to grow on a GaAs (001) substrate using the crystal growth observing apparatus with the structure mentioned above.

The STM (2) was housed in the lower portion of the MBE device (1) by the STM drive mechanism (3) and a GaAs buffer was made to grow by the MBE growing method after cleaning the surface of the GaAs substrate.

The STM was moved upward with the temperature of the substrate (4) preserved and the substrate holder (11) was lifted while catching the substrate holder (11) by the projections (23) at three positions opposed to the substrate holder (11).

The substrate holder (11) was separated from the substrate heating mechanism (14) and was itself incorporated with the STM (2) through the wide clearance formed between the substrate holder (11) and the substrate heating mechanism (14).

The STM probe (22) was moved into contact with the surface of the substrate (4). A STM observation mode was prepared.

Subsequently, raw materials in the amount of which an atomic layer was formed were supplied by opening the shutter of Ga molecular beam cells. STM observation was performed.

A plurality of Ga clusters with the diameter of about 1 nm were observed in the observation area with the size of 50 nm×50 nm. This exposed an initial process of Ga crystal growing.

Figure 5:
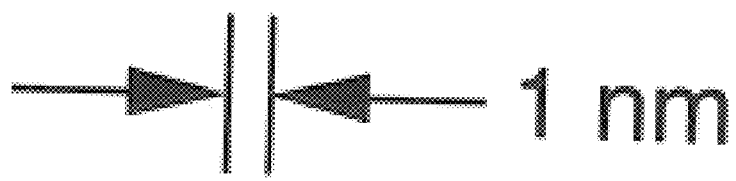
FIG. 5 is a STM image of a Ga layer.
Figure 5:
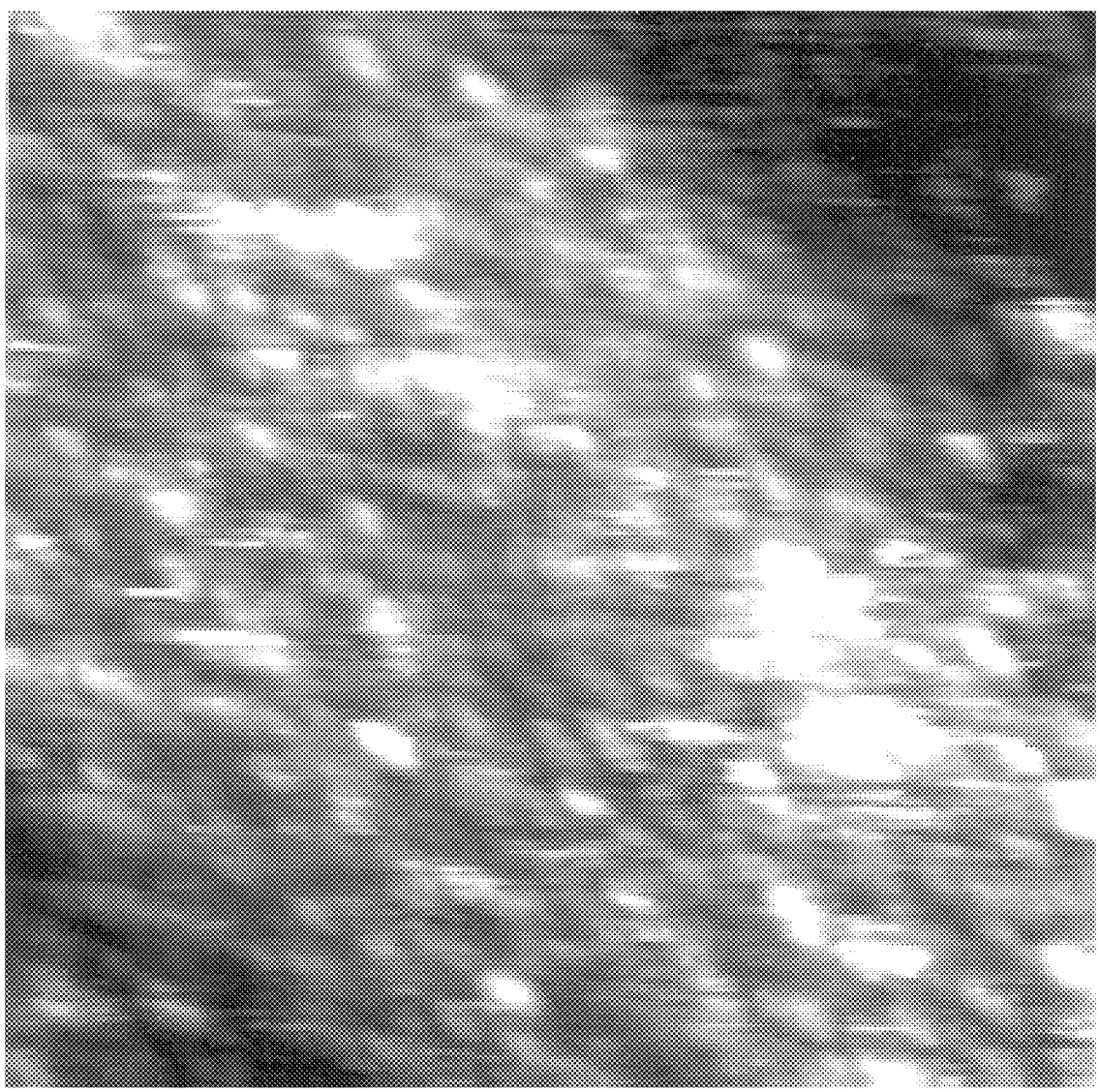

FIG. 5 is a STM image obtained immediately after supplying Ga molecular beam on the GaAs (001) substrate in the process of MBE crystal growing at 200° C.

The amount of Ga molecular beam can be freely changed. As molecular beam can be temporarily supplied together with Ga molecular beam. Other raw materials such as In can also be supplied. As far as the substrate is conductive, observation will be possible with substrates other than GaAs.

What is claimed is:

1. An apparatus for observing crystal growth, comprising a molecular beam epitaxy device having a vacuum vessel; a scanning tunneling microscope having a probe, said scanning tunneling microscope being incorporated with said molecular beam epitaxy device and being protected from vapor pressure atmosphere and radiant heat by a heat insulating shield; a substrate holder disposed in said vacuum vessel of the molecular beam epitaxy device, said substrate holder being provided with a substrate heating system and said substrate holder being supported only by the scanning tunneling microscope during observation; and a drive mechanism causing the scanning tunneling microscope to move upward and downward while leaving the scanning tunneling microscope opposed to said substrate holder.

2. The apparatus as claimed in claim 1, wherein the substrate holder is connected to a casing of said substrate heating system with a clearance and the connection is released during observation so that the substrate holder may be supported only by the scanning tunneling microscope.

3. The apparatus as claimed in claim 2, wherein pins are provided with said casing of the substrate heating system and the substrate holder is connected to the casing by engagement of said pins with notches formed in the casing.

* * * * *